US008801400B2

(12) United States Patent
Thibodeaux et al.

(10) Patent No.: US 8,801,400 B2
(45) Date of Patent: Aug. 12, 2014

(54) SECURE CONNECTION TERMINAL FOR HERMETIC COMPRESSOR

(75) Inventors: Lamar Wilson Thibodeaux, Arkadelphia, AR (US); Thierry Poiret, Trevoux (FR); Sui Yong, Tianjin (CN); Zhao Yanbo, Tianjin (CN); Zili Sun, Arkadelphia, AR (US)

(73) Assignee: Danfoss Scroll Technologies LLC, Arkadelphia, AR (US)

( * ) Notice: Subject to any disclaimer, the term of this patent is extended or adjusted under 35 U.S.C. 154(b) by 244 days.

(21) Appl. No.: 13/178,616

(22) Filed: Jul. 8, 2011

(65) Prior Publication Data

US 2013/0011279 A1 Jan. 10, 2013

(51) Int. Cl.

| | |
|---|---|
| ***F04B 17/00*** | (2006.01) |
| ***F04B 35/04*** | (2006.01) |
| ***H01H 39/00*** | (2006.01) |
| ***H01H 61/00*** | (2006.01) |
| ***H05K 7/00*** | (2006.01) |

(52) U.S. Cl.
USPC ............ 417/410.1; 337/35; 337/89; 361/728; 361/732

(58) Field of Classification Search
USPC ............ 417/410.1; 337/35, 89; 361/728, 732; 439/521, 378, 685, 607.19, 188; 174/138 F
See application file for complete search history.

(56) References Cited

U.S. PATENT DOCUMENTS 2,942,226 A * 6/1960 Low .............................. 439/296
4,026,620 A * 5/1977 Lieberman .................... 439/189
4,319,299 A * 3/1982 Woods et al. ................... 361/24
4,350,403 A * 9/1982 Seytre et al. .................. 439/325
4,427,249 A * 1/1984 Bright et al. ..................... 439/68
4,798,542 A * 1/1989 Asick et al. ................... 439/188
5,199,898 A * 4/1993 Wisner .......................... 439/367
5,328,338 A * 7/1994 Hirano et al. ................. 417/312
5,402,319 A * 3/1995 Shumaker et al. ............ 361/796
5,584,716 A * 12/1996 Bergman ...................... 439/282
6,227,889 B1 * 5/2001 Wu .............................. 439/188
6,247,948 B1 * 6/2001 Davis et al. ................... 439/188
6,290,528 B1 * 9/2001 Moore et al. .................. 439/367
6,372,993 B1 * 4/2002 Eckels et al. .......... 174/152 GM
6,767,243 B2 * 7/2004 McCoy .......................... 439/521
6,779,989 B2 * 8/2004 Makino et al. ............. 417/410.1
8,262,372 B2 * 9/2012 Wang et al. ................ 417/410.1
8,264,317 B2 * 9/2012 Higashikata .................. 337/343
2001/0001638 A1 * 5/2001 Hirooka ..................... 417/410.1
2006/0198107 A1 * 9/2006 Azar et al. .................... 361/704
2007/0115707 A1 5/2007 Koide
2009/0047823 A1 * 2/2009 Lin et al. ....................... 439/370
2010/0196175 A1 * 8/2010 Bedell et al. ............... 417/410.5

FOREIGN PATENT DOCUMENTS

WO 2010080984 7/2010

* cited by examiner

*Primary Examiner* — Devon Kramer
*Assistant Examiner* — Lilya Pekarskaya
(74) *Attorney, Agent, or Firm* — Carlson, Gaskey & Olds, PC

(57) ABSTRACT

A sealed compressor has an electric motor driving a compressor pump unit, and a shell enclosing the electric motor and compressor pump unit. An electrical connector with the shell supplies electrical power to the motor. A terminal housing is mounted to an outer surface of the shell, and a terminal plug is received within the terminal housing. The terminal plug has electric connections to connect into the electric connector within the shell. The housing includes a cover plate enclosing a chamber for the housing and which receives the terminal plug. A spring extends from the terminal plug, and reacts against a surface of the cover to bias the terminal plug to maintain the electric connection between the terminal plug and the electrical connector in the shell.

9 Claims, 2 Drawing Sheets

SECURE CONNECTION TERMINAL FOR HERMETIC COMPRESSOR

BACKGROUND

This application relates to an electric terminal which provides a secure connection to an electric motor within a hermetically sealed compressor.

Compressors are known and typically include a motor driving a compressor pump unit within a sealed shell. The shell is typically sealed, as refrigerant circulates within the shell to cool the motor. Even though the shell is sealed, an electric connection must still extend into the shell to supply power to the motor.

The connection must be waterproof, leak proof, and further must be resilient enough to maintain a good electrical connection, even when vibration or other challenges are encountered.

SUMMARY

A sealed compressor has an electric motor driving a compressor pump unit, and a shell enclosing the electric motor and compressor pump unit. An electrical connector within the shell supplies electrical power to the motor. A terminal housing is mounted to an outer surface of the shell, and a terminal plug is received within the terminal housing. The terminal plug has electric connections to connect into the electric connector within the shell. The housing includes a cover plate enclosing a chamber for the housing and which receives the terminal plug. A spring extends from the terminal plug, and reacts against a surface of the cover to bias the terminal plug to maintain the electric connection between the terminal plug and the electrical connector in the shell.

These and other features of the present invention can be best understood from the following specification and drawings, of which the following is a brief description.

DETAILED DESCRIPTION

Figure 1:
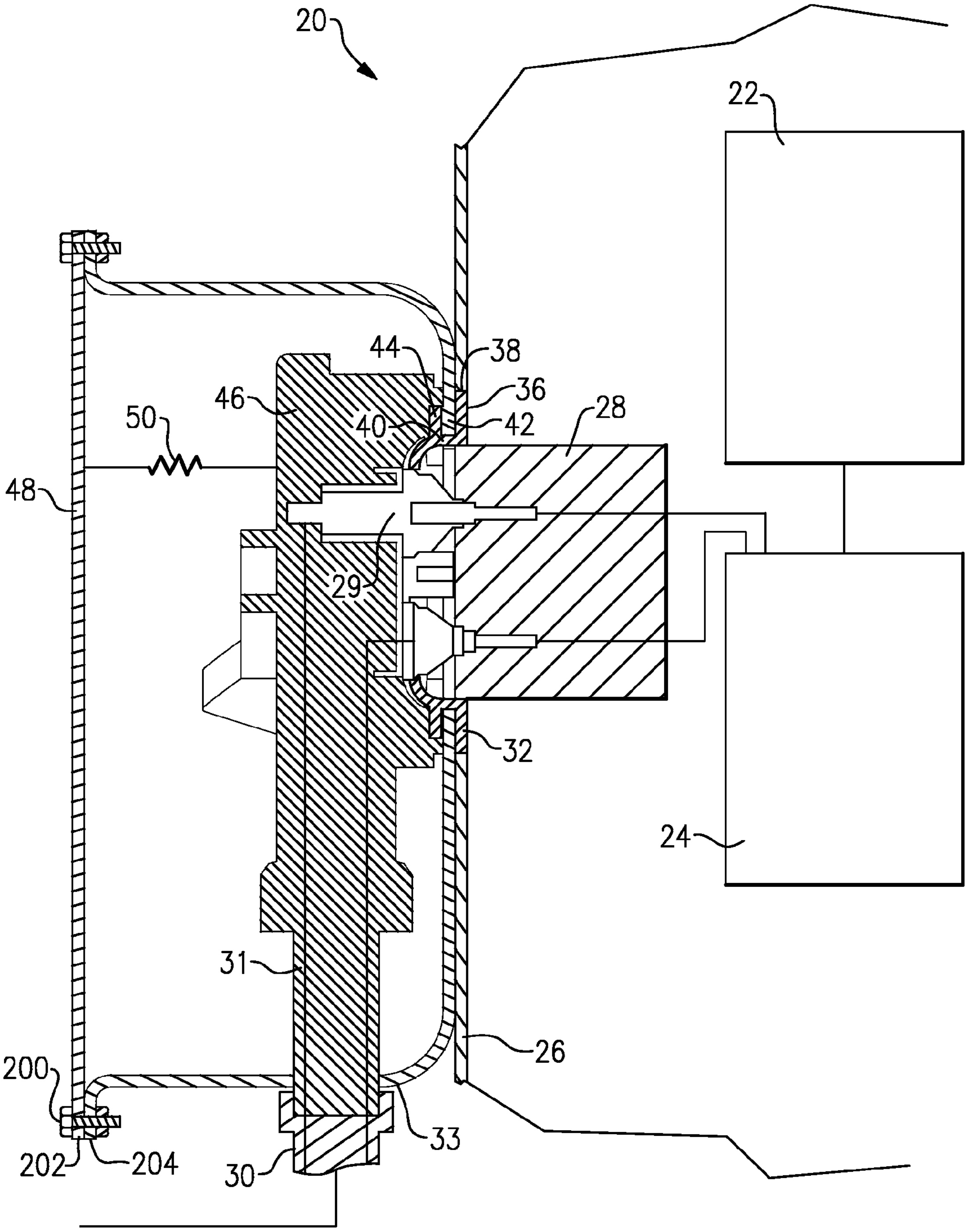
FIG. 1 schematically shows a compressor incorporating an electric terminal connection.

FIG. 1 shows a sealed compressor 20 incorporating a compressor pump unit 22 and an electric motor 24. A shell 26 defines an interior which is sealed against fluid leakage. Refrigerant typically flows around the motor 24 within the shell 26. Electric power must be supplied to the motor 24, and an electric connector 28 is shown inward of the shell 26. A terminal connection 29 is shown extending from a terminal plug 31 which is connected within a fence or housing 42.

A cable 30 plugs into an end of the terminal plug 31 outwardly of the housing 42. A hole 33 allows the terminal plug 31 to exit the housing. A cover 46 is shown secured, such as by being bolted at 200 to the housing at an ear 204 and holes 202 in cover 46.

A grommet 32 provides a fluid tight seal between the housing 42 and the shell 26. As shown, the grommet 32 has ears 44 sitting outwardly of an end of the housing 42, and an end 36 which seals against the shell 26. A portion 40 seals on terminal plus 31.

As shown in this Figure, a spring 50 is schematically biasing a surface 46 of the terminal plug 31 to maintain the connection between connector 28 and terminal connection 29.

Figure 2B:
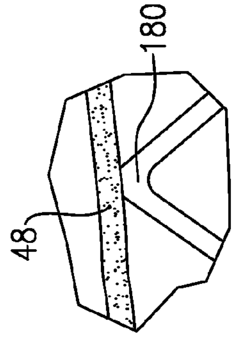
FIG. 2B shows a feature of the embodiment.
Figure 2A:
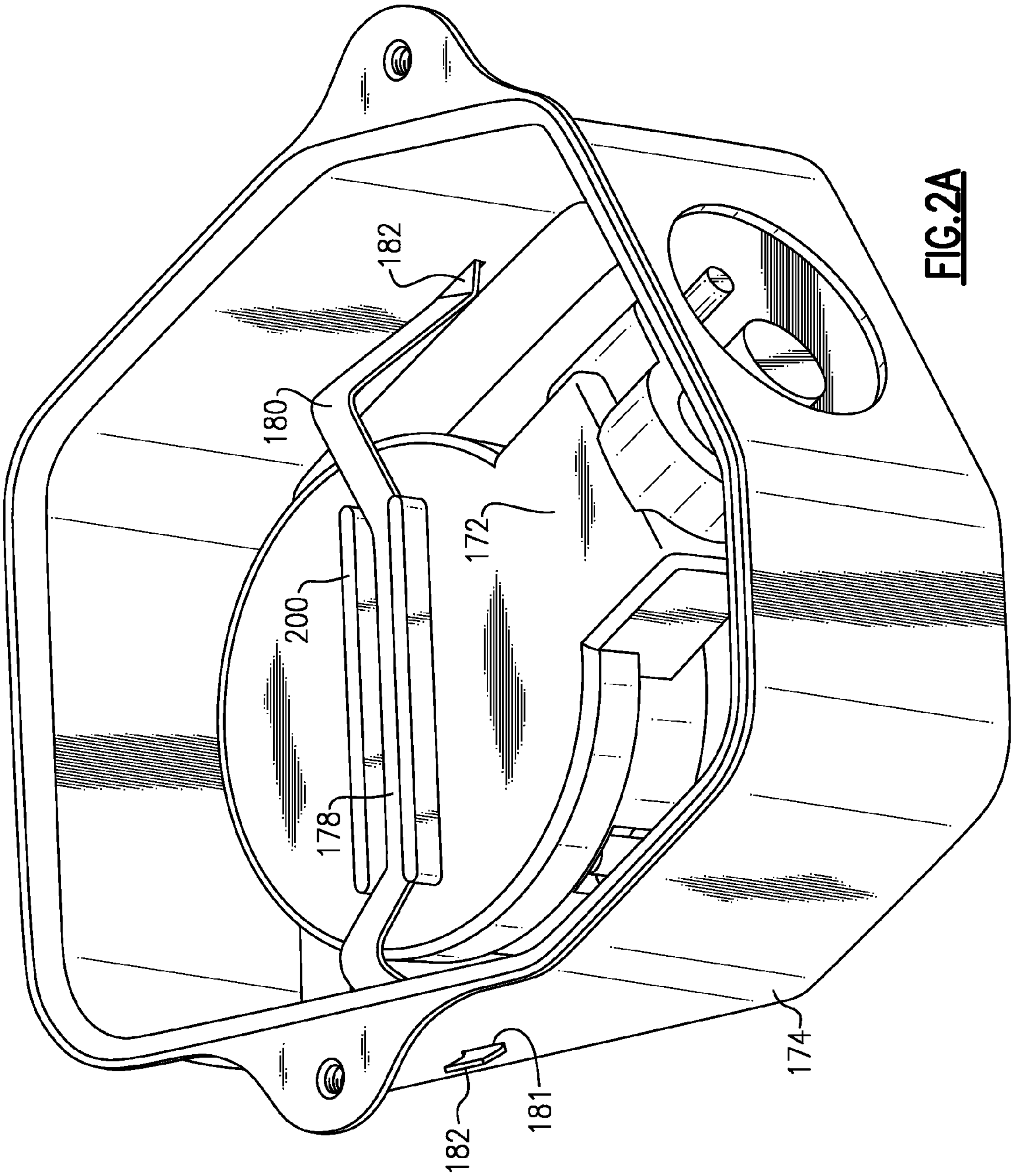
FIG. 2A shows an embodiment of the terminal plug.

The FIGS. 2A and 2B show an embodiment of this spring 50.

FIG. 2A shows a terminal plug 172 having a spring 178 with ends 180 extending outwardly and having feet 182 extending through slots 181 in housing 174.

FIG. 2B shows further details of the plug 172 including spring 178 having ends 180 in contact with cover 46. The spring 178 is secured between rails 200.

The cable is shown schematically, however, details are better disclosed in co-pending U.S. patent application Ser. No. 13/178,568, filed on even date herewith, and entitled "Terminal Connection for Sealed Compressor." The sealing grommet is better disclosed in co-pending U.S. application Ser. No. 13/178,555, filed on even date herewith, and entitled "Sealing Grommet For Connection Between Terminal Box And Interior Of Sealed Compressor."

Although embodiments of this invention have been disclosed, a worker of ordinary skill in this art would recognize that certain modifications would come within the scope of this invention. For that reason, the following claims should be studied to determine the true scope and content of this invention.

What is claimed is:

1. A sealed compressor including:

an electric motor driving a compressor pump unit, and a shell enclosing said electric motor and said compressor pump unit, and an electrical connector within the shell to supply electrical power to the motor;

a terminal housing mounted to an outer surface of said shell, and a terminal plug received within said terminal housing, said terminal plug having electric connections connected to said electric connector within said shell;

said housing secured to a cover plate enclosing a chamber in said housing and which receives said terminal plug; and a spring extending from said terminal plug, and reacting against a surface of said cover to bias said terminal plug to maintain said electric connections between said terminal plug and said electrical connector in said shell, wherein said spring is secured between rails on a surface of said terminal plug facing said cover.

2. The compressor as set forth in claim 1, wherein said spring extends outwardly of said terminal plug, and includes a pair of bowed portions in contact with said cover.

3. The compressor as set forth in claim 2, wherein said spring has feet extending through slots in the terminal housing.

4. The compressor as set forth in claim 3, wherein said spring is secured between said rails at a central portion of said spring, with one of said pair of bowed portions being positioned at ends spaced away from a portion of said spring secured between said rails, and said feet being positioned outwardly of said bowed portions.

5. The compressor as set forth in claim 1, wherein said spring has feet extending through slots in the terminal housing.

6. The compressor as set forth in claim 5, wherein a pair of bowed portions is positioned inwardly on said feet.

7. The compressor as set forth in claim 1, wherein said spring is also secured to said terminal housing.

8. The compressor as set forth in claim 1, wherein said cover is bolted to said housing.

9. A sealed compressor including:

an electric motor driving a compressor pump unit, and a shell enclosing said electric motor and said compressor pump unit, and an electrical connector within the shell to supply electrical power to the motor;

a terminal housing mounted to an outer surface of said shell, and a terminal plug received within said terminal housing, said terminal plug having electric connections connected to said electric connector within said shell;

said housing secured to a cover plate enclosing a chamber in said housing and which receives said terminal plug;

a spring extending from said terminal plug, and reacting against a surface of said cover to bias said terminal plug to maintain said electric connections between said terminal plug and said electrical connector in said shell, said spring extending outwardly of said terminal plug, and including a pair of bowed portions in contact with said cover, said spring being secured between rails on a surface of said terminal plug facing said cover;

said spring having feet extending through slots in the terminal housing; and said spring being secured between said rails at a central portion of said spring, with one of said pair of bowed portions being positioned at ends spaced away from a portion of said spring secured between said rails, and said feet being positioned outwardly of said bowed portions.

* * * * *